US012581666B2

(12) United States Patent
Chen et al.

(10) Patent No.: US 12,581,666 B2
(45) Date of Patent: Mar. 17, 2026

(54) MEMORY DEVICE BASED ON THYRISTORS

(71) Applicant: MACRONIX INTERNATIONAL CO., LTD., Hsinchu (TW)

(72) Inventors: Wei-Chen Chen, Taoyuan County (TW); Hang-Ting Lue, Zhubei City (TW)

(73) Assignee: MACRONIX INTERNATIONAL CO., LTD., Hinschu (TW)

( * ) Notice: Subject to any disclaimer, the term of this patent is extended or adjusted under 35 U.S.C. 154(b) by 455 days.

(21) Appl. No.: 18/457,412

(22) Filed: Aug. 29, 2023

(65) Prior Publication Data

US 2024/0407181 A1     Dec. 5, 2024

Related U.S. Application Data

(60) Provisional application No. 63/470,186, filed on Jun. 1, 2023.

(51) Int. Cl.
| | |
|---|---|
| *G11C 11/39* | (2006.01) |
| *G11C 5/06* | (2006.01) |
| *H10B 99/00* | (2023.01) |
| *H10D 18/00* | (2025.01) |

(52) U.S. Cl.
CPC ............. *H10B 99/20* (2023.02); *G11C 5/063* (2013.01); *G11C 11/39* (2013.01); *H10D 18/00* (2025.01)

(58) Field of Classification Search
CPC ......... H10B 12/10; G11C 5/063; G11C 11/39; H10D 18/00

USPC ............................................ 365/184, 230.06
See application file for complete search history.

(56) References Cited

U.S. PATENT DOCUMENTS

| | | | | |
|---|---|---|---|---|
| 9,183,935 | B2 * | 11/2015 | Fukuzumi | G11C 16/10 |
| 9,792,991 | B1 * | 10/2017 | Toriyama | G11C 11/5628 |
| 11,081,190 | B1 * | 8/2021 | Anand | G11C 16/0483 |
| 2011/0103153 | A1 * | 5/2011 | Katsumata | G11C 16/06 |
| | | | | 365/185.23 |
| 2019/0198078 | A1 * | 6/2019 | Hoang | G11C 11/161 |
| 2021/0408120 | A1 * | 12/2021 | Lin | H10D 30/6757 |
| 2022/0059168 | A1 * | 2/2022 | Seo | G11C 16/0483 |
| 2022/0199532 | A1 * | 6/2022 | Kamisaka | H10B 43/50 |
| 2022/0238162 | A1 * | 7/2022 | Yada | H10B 41/35 |
| 2022/0293198 | A1 * | 9/2022 | Sakakibara | G11C 16/24 |

(Continued)

*Primary Examiner* — Michael T Tran
(74) *Attorney, Agent, or Firm* — McClure, Qualey & Rodack, LLP

(57) ABSTRACT

A memory device based on thyristors, comprises the following elements. A plurality of gate structures, are continuous structures in the first direction. A plurality of bit lines, extending in a second direction substantially perpendicular to the first direction. A plurality of source lines, extending in the first direction. A plurality of channels, extending in a third direction substantially perpendicular to the first direction and the second direction, and penetrating the gate structures. The first doped regions of the channels are coupled to the bit lines, and the second doped regions of the channels are coupled to the source lines. A plurality of memory units formed by the gate structures and corresponding channels. The source lines are arranged in sequence according to the second direction to form a stair structure, and the lengths of the source lines decrease in sequence in the first direction.

20 Claims, 15 Drawing Sheets

(56)  References Cited

U.S. PATENT DOCUMENTS

| | | | |
|---|---|---|---|
| 2022/0343980 A1 * | 10/2022 | Kamisaka .............. | H10B 43/10 |
| 2025/0267868 A1 * | 8/2025 | Lin ........................ | H10B 43/27 |

* cited by examiner

4000

BL1

BL2

BL3    sgL1 sgL2 sgL3

O3

O2

O1

T5

B1

T4

T1

G3
G2
G1

SLCC2

SLCC1

SL1

T3

4000

SLCC1
SLCC2
SLCC3
T3
B1
T2
BL1
BL2
BL3
sgL1
sgL2
sgL3
SL3
T5
T4
O3
O2
O1
G1
G2
G3

4000

T3

B1
SLCC1
SL1
SLCC2
SL2
SLCC3
SL3

T1

BL1
BL2
BL3

G3
G2
G1

O3
O2
O1 sgL1
sgL2
sgL3

T4
T5

MEMORY DEVICE BASED ON THYRISTORS

This application claims the benefit of U.S. provisional application Ser. No. 63/470,186, filed Jun. 1, 2023, the entirety of which is incorporated herein by reference.

TECHNICAL FIELD

The present disclosure relates to a semiconductor memory device, and more particularly relates to a memory device based on thyristors.

BACKGROUND

With the development of semiconductor technology, various types of semiconductor memory devices have been widely developed. One type of memory device is based on thyristors, and each memory unit of the memory device is a thyristor. According to the operating characteristics of the thyristors, the current-voltage curve of the memory unit is highly nonlinear, and the memory unit has a very large on-off current ratio, hence the memory device may have a self-selecting function.

The memory device based on thyristors has a three-dimensional structure. The gate structures, source lines and bit lines of the memory device form a cross-bar array, and the structure of the memory device is relatively complicated. Therefore, it is necessary to improve and simplify the structure of memory device. In addition, in response to the structure of the memory device and the operating characteristics of the thyristors, a more precise control method for the memory device is required, for precisely controlling the memory device to perform read operations, write operations and erase operations.

SUMMARY

According to an aspect of the present disclosure, a memory device based on thyristors is provided. The memory device includes the following elements. A plurality of gate structures, each extending in a first direction, and each of the gate structures is a continuous structure in the first direction. A plurality of bit lines, each extending in a second direction, the second direction is substantially orthogonal to the first direction. A plurality of source lines, each extending in the first direction. A plurality of channels, each extending in a third direction and penetrating each of the gate structures, the third direction is substantially perpendicular to the first direction and the second direction, a first doped region of each channel is coupled to a corresponding one of the bit lines, and a second doped region of each channel is coupled to a corresponding one of the source lines. A plurality of memory units, each formed by the gate structures and a corresponding one of the channels. The gate structures are sequentially arranged according to the third direction, the bit lines are sequentially arranged according to the first direction, the source lines are sequentially arranged according to the second direction to form a stair structure, and the lengths of the source lines in the first direction are sequentially decreased.

Figure 1A:
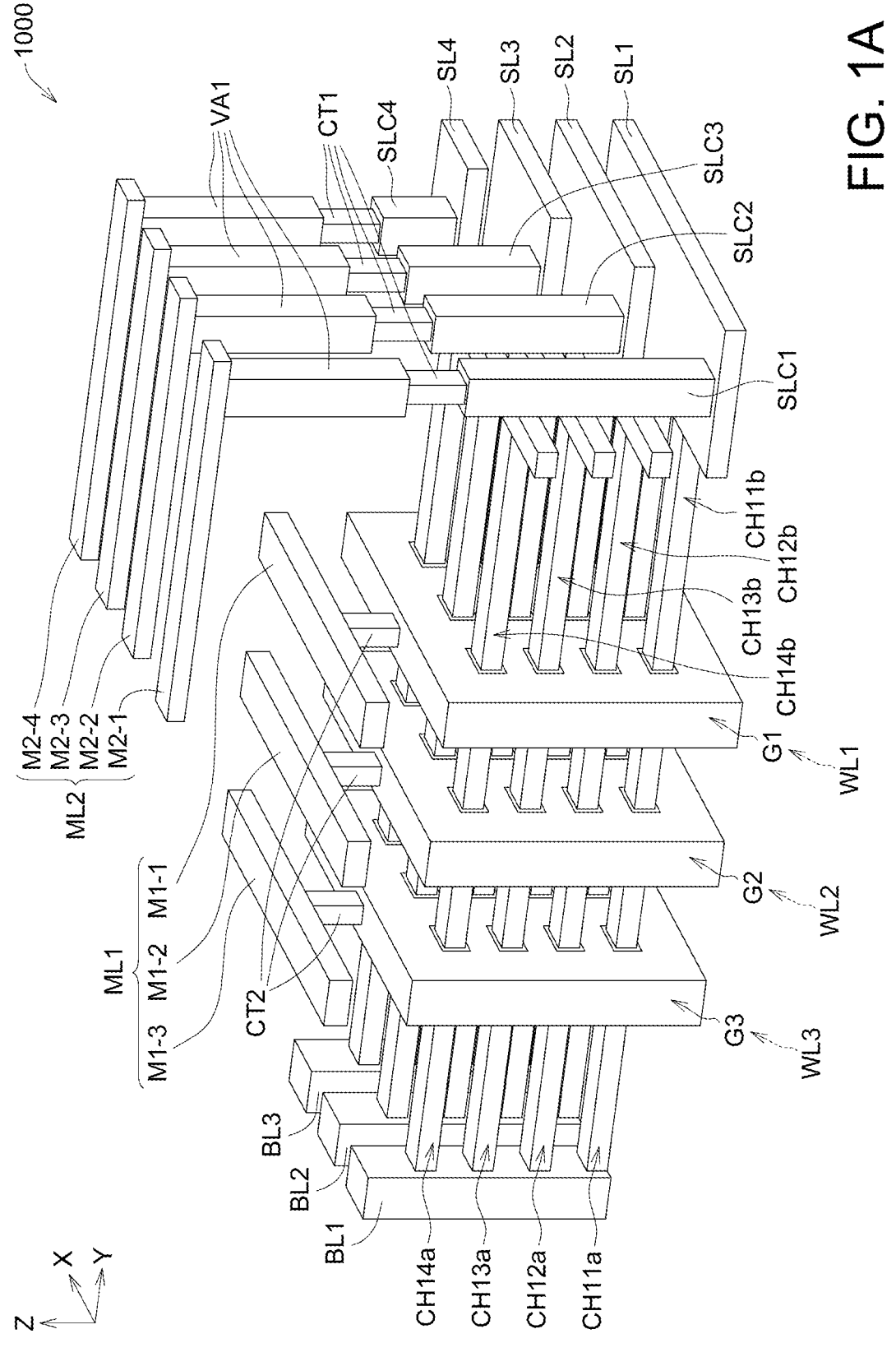
FIGS. 1A and 1B are three-dimensional schematic diagrams of a memory device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

Figure 1B:
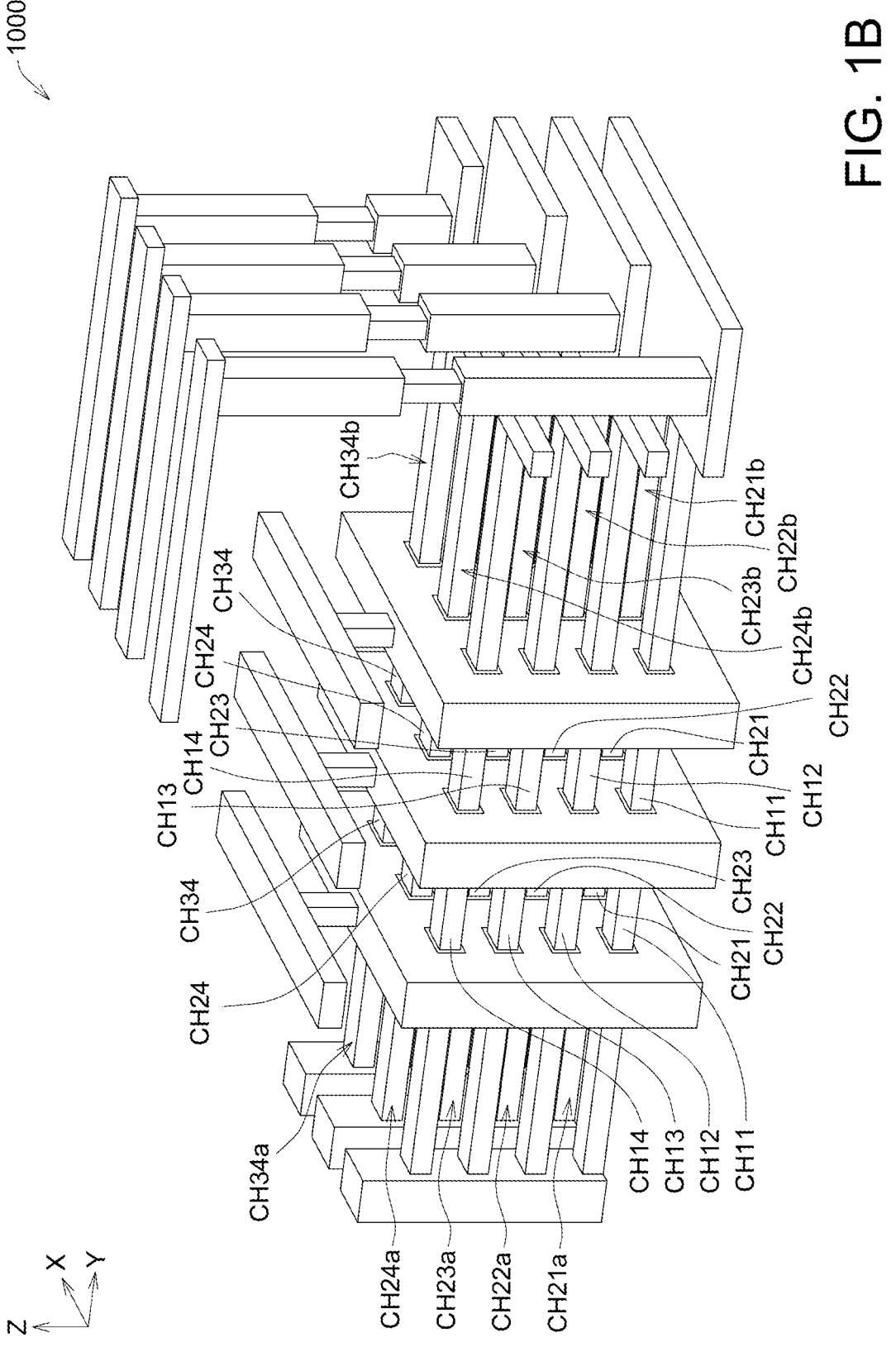

Please refer to FIGS. 1A and 1B, which are three-dimensional schematic diagrams of a memory device 1000 according to an embodiment of the present disclosure (FIGS. 1A and 1B both depict the same memory device 1000, and FIGS. 1A and 1B mark the element symbols of different elements of the memory device 1000 respectively). The memory device 1000 comprises a plurality of memory units, and each memory unit is a thyristor. More specifically, the memory unit of the memory device 1000 utilizes gates to control the operation of the thyristor, hence the memory unit is also referred to as a gate-controlled-thyristor (GCT). Based on the characteristics of the gate-controlled-thyristor, the access speed of the memory device 1000 may reach the level of random access memory (RAM).

The memory device 1000 comprises a plurality of gate structures G1, G2 and G3, and the operation of the memory device 1000 is controlled by biases applied to the gate structures G1-G3. The gate structures G1, G2 and G3 have, for example, dielectric materials. The gate structures G1, G2 and G3 are respectively coupled to the word lines WL1, WL2 and WL3 (or the gate structures G1, G2 and G3 themselves may be part of the word lines WL1, WL2 and WL3). Each of the gate structures G1-G3 extends in the X direction, and each of the gate structures G1-G3 is a continuous structure in the X direction. In addition, the gate structures G1-G3 are arranged in sequence according to the Y direction as: the gate structure G3, the gate structure G2 and the gate structure G1, and the Y direction is substantially orthogonal to the X direction.

The metal layer ML1 is a patterned metal layer of conductive material, and the metal layer ML1 comprises, for example, three metal layer elements M1-1, M1-2 and M1-3.

Each of the metal layer elements M1-1-M1-3 extends in the X direction. The metal layer elements M1-1-M1-3 are respectively coupled to the gate structures G1-G3 through the connecting elements CT2. The gate voltages $V_{G1}$, $V_{G2}$ and $V_{G3}$ generated by an external control circuit (not shown in the figures) of the memory device 1000 are transmitted to the gate structures G1-G3 through the metal layer elements M1-1, M1-2 and M1-3 and the connecting elements CT2.

The memory device 1000 further comprises a plurality of bit lines BL1, BL2 and BL3. Each of the bit lines BL1-BL3 extends in the Z direction, and the Z direction is substantially perpendicular to the X direction and the Y direction. These bit lines BL1-BL3 have a structure in the form of a plug. Moreover, according to the X direction, bit lines BL1-BL3 are arranged in an order of: the bit line BL1, the bit line BL2 and the bit line BL3. The bit line voltages $V_{BL1}$, $V_{BL2}$ and $V_{BL3}$ generated by the external control circuit of the memory device 1000 are transmitted to the bit lines BL1, BL2 and BL3.

The memory device 1000 further comprises a plurality of source lines SL1, SL2, SL3 and SL4. Each of the source lines SL1-SL4 extends in the X direction, and is arranged in sequence according to the Z direction as: the source line SL1, the source line SL2, the source line SL3 and the source line SL4, which form a stair structure. The source line SL4 is located at a top layer of the stair structure, and the source line SL1 is located at a bottom layer of the stair structure. The lengths of the source lines SL1-SL4 in the X direction are sequentially decreased, the length of the source line SL1 in the X direction is the largest, and the length of the source line SL4 in the X direction is the smallest. The source lines SL1, SL2, SL3 and SL4 are further respectively coupled to the connecting elements SLC1, SLC2, SLC3 and SLC4. Each of the connecting elements SLC1-SLC4 extends in the Z direction. Corresponding to the source lines SL1-SL4 of the stair structure, the lengths of the connecting elements SLC1-SLC4 in the Z direction are sequentially decreased, the length of the connecting element SLC1 in the Z direction is the largest, and the length of the connecting element SLC4 in the Z direction is the smallest. The bit lines BL1-BL3 are substantially perpendicular to the source lines SL1-SL4, forming a 3D stackable cross-bar array.

The metal layer ML2 is a patterned conductive metal layer, and the metal layer ML2 comprises, for example, four metal layer elements M2-1, M2-2, M2-3 and M2-4. Each of the metal layer elements M2-1-M2-4 extends in the Y direction. The metal layer elements M2-1-M2-4 are respectively coupled to the connecting elements SLC1-SLC4 through the connecting elements VA1 and the connecting elements CT1, and further coupled to the source lines SL1-SL4. The source line voltages $V_{SL1}$, $V_{SL2}$, $V_{SL3}$, and $V_{SL4}$ generated by the external control circuit (not shown in the figure) of the memory device 1000 are transmitted to the source lines SL1, SL2, SL3 and SL4 through the metal layer elements M2-1, M2-2, M2-3, and M2-4, the connecting elements VA1, the connecting elements CT1 and the connecting elements SLC1-SLC4.

The memory device 1000 of this embodiment comprises two metal layers ML1 and ML2. The metal layer elements M1-1-M1-3 of the metal layer ML1 are substantially orthogonal to the metal layer elements M2-1-M2-4 of the metal layer ML2, and the projection of the metal layer ML1 on the XY plane overlaps the projection of the metal layer ML2. The memory device 1000 only needs two metal layers to operate, and the required number of metal layers is relatively small.

The memory device 1000 further comprises a plurality of channels CH11, CH12, CH13, CH14, CH21, CH22, CH23, CH24, CH31, CH32, CH33 and CH34. Each of the channels CH11-CH34 extends in the Y direction and penetrates each of the gate structures G1-G3. The four channels CH11-CH14 are commonly coupled to the bit line BL1. Moreover, the channel CH11 is coupled to the source line SL1, the channel CH12 is coupled to the source line SL2, the channel CH13 is coupled to the source line SL3, and the channel CH14 is coupled to the source line SL4. More specifically, each of the channels CH11-CH34 has a P+ doped region and an N+ doped region. The P+ doped region CH11a of the channel CH11 is coupled to the bit line BL1, and the N+ doped region CH11b of the channel CH11 is coupled to the source line SL1. The P+ doped region CH12a of the channel CH12 is coupled to the bit line BL1, and the N+ doped region CH12b of the channel CH12 is coupled to the source line SL2. The P+ doped region CH13a of the channel CH13 is coupled to the bit line BL1, and the N+ doped region CH13b of the channel CH13 is coupled to the source line SL3. The P+ doped region CH14a of the channel CH14 is coupled to the bit line BL1, and the N+ doped region CH14b of the channel CH14 is coupled to the source line SL4.

Similarly, the other four channels CH21-CH24 are commonly coupled to the bit line BL2. Moreover, the channel CH21 is coupled to the source line SL1, the channel CH22 is coupled to the source line SL2, the channel CH23 is coupled to the source line SL3, and the channel CH24 is coupled to the source line SL4. The respective P+ doped regions CH21a, CH22a, CH23a and CH24a of the channels CH21, CH22, CH23 and CH24 are commonly coupled to the bit line BL2, and the respective N+ doped regions CH21b, CH22b, CH23b and CH24b of the channels CH21, CH22, CH23 and CH24 are respectively coupled to the source lines SL1, SL2, SL3 and SL4. On the other hand, the P+ doped regions CH31a-CH34a of the other four channels CH31-CH34 are commonly coupled to the bit line BL3, and the N+ doped regions CH31b-CH34b of the CH31-CH34 are respectively coupled to the source lines SL1-SL4.

The channels CH11-CH34 are arranged in an array, and the array has 4 layers. The first layer comprises the channels CH11, CH21 and CH31, the second layer comprises the channels CH12, CH22 and CH32, the third layer comprises the channels CH13, CH23 and CH33, and the fourth layer comprises the channels CH14, CH24 and CH34.

The four channels CH11, CH12, CH13 and CH14 disposed on different layers of the array are commonly coupled to the bit line BL1, so the equivalent capacitance of the bit line BL1 may be evenly distributed in each layer of the array. Similarly, the four channels CH21, CH22, CH23 and CH24 disposed on different layers of the array are commonly coupled to the bit line BL2, and the four channels CH31, CH32, CH33 and CH34 disposed on different layers of the array are commonly coupled to the bit line BL3, so the equivalent capacitance of the bit lines BL2 and BL3 may be evenly distributed in each layer of the array. Moreover, as mentioned above, each of the gate structures G1-G3 is a continuous structure in the X direction, so all the channels CH11-CH34 share the same gate structures G1-G3, and all the channels CH11-CH34 are controlled by the same word lines WL1-WL3.

The above-mentioned bit lines BL1-BL3, source lines SL1-SL4, connecting elements SLC1-SLC4, connecting elements VA1, connecting elements CT1 and connecting elements CT2 all have conductive materials. Moreover, the channels CH11-CH34 have, for example, polysilicon material.

Each memory unit of the memory device 1000 is formed by the three gate structures G1-G3 and a corresponding one of the channels CH11-CH34. The memory units are arranged as an array according to the X direction and the Z direction. For example, the channel CH11 and the gate structures G1-G3 form the memory unit 11, the channel CH12 and the gate structures G1-G3 form the memory unit 12, and so on. Taking the memory unit 11 as an example, the drain of the memory unit 11 is coupled to the bit line BL1, and the source of the memory unit 11 is coupled to the source line SL1. The memory unit 11 performs a write operation, a read operation, or an erase operation according to the respective bias voltages of the gate structures G1-G3, the bit line BL1 and the source line SL1.

Figure 2:
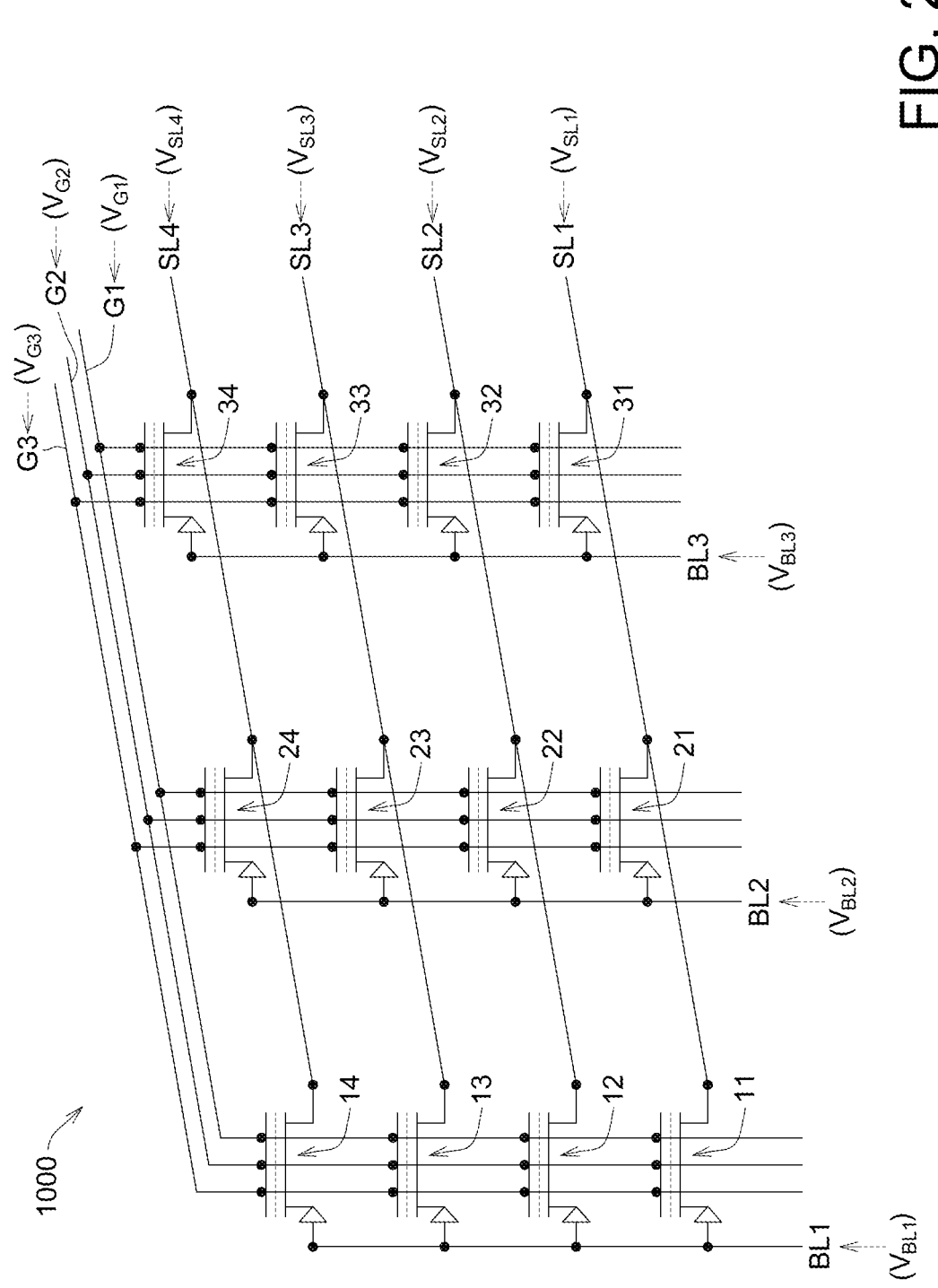
FIG. 2 is a circuit diagram of the memory device in FIGS. 1A and 1B.

Next, please refer to FIG. 2, which is a circuit diagram of the memory device 1000 in FIGS. 1A and 1B. The memory device 1000 comprises, for example, 12 memory units 11, 12, 13, 14, 21, 22, 23, 24, 31, 32, 33 and 34. The memory units 11-34 are arranged as an array according to the X direction and the Z direction. Each of the memory units 11-34 is associated with three gate structures G1-G3, and the gate structures G1-G3 of each of the memory units 11-34 receive the gate voltages $V_{G1}$-$V_{G3}$ through the word lines WL1-WL3.

Moreover, the drains of the memory units 11-34 are coupled to corresponding bit lines and receive corresponding bit line voltages. The sources of the memory units 11-34 are coupled to corresponding source lines and receive corresponding source line voltages. For example, the memory unit 11 is coupled to the bit line BL1 and the source line SL1, the memory unit 11 receives the bit line voltage $V_{BL1}$ through the bit line BL1, and receives the source line voltage $V_{SL1}$ through the source line SL1. The memory unit 12 is coupled to the bit line BL1 and the source line SL2, the memory unit 12 receives the bit line voltage $V_{BL1}$ through the bit line BL1, and receives the source line voltage $V_{SL2}$ through the source line SL2. And the like for other memory units 13-34.

Figure 3:
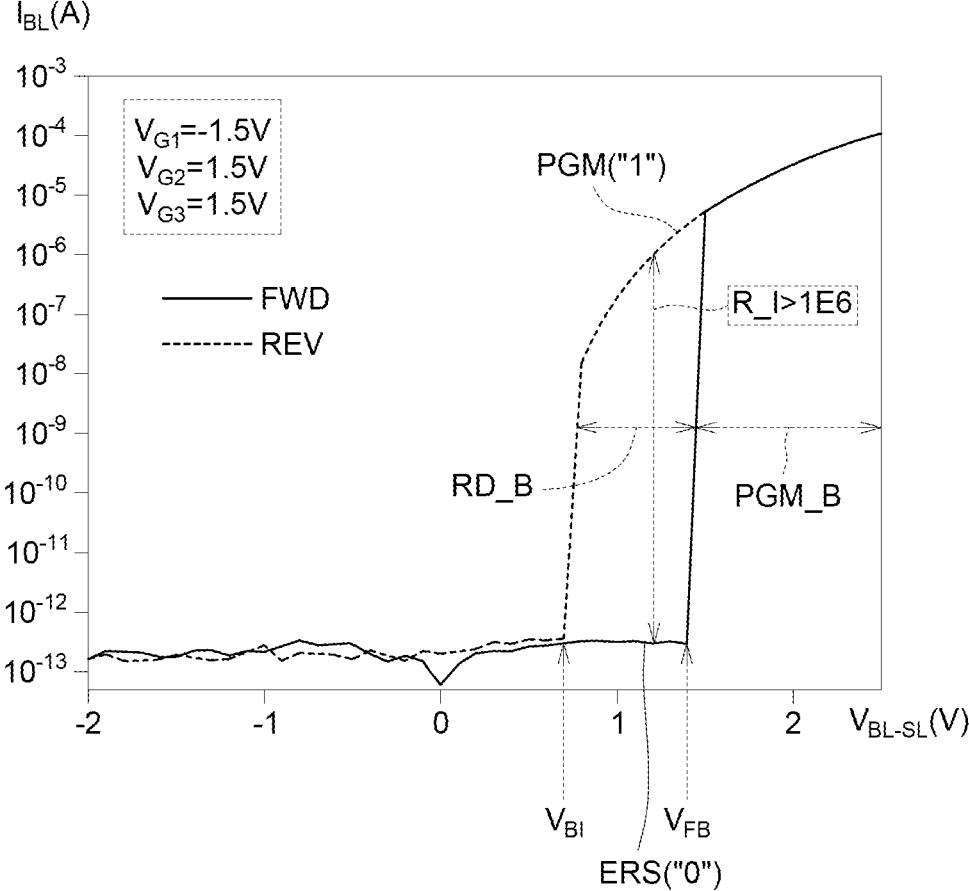
FIG. 3 is a diagram of a curve of the current-voltage relationship of one of the memory units of the memory device in FIG. 2.

Next, please refer to FIG. 3, which is a diagram of a curve of the current-voltage relationship of one of the memory units of the memory device 1000 in FIG. 2. The current-voltage curve of the memory unit is highly non-linear, and the memory unit may be operated in the states of forward bias FWD or reverse bias REV, and the memory unit has the operation characteristics of a diode. In operation, when the memory unit performs a program operation (i.e., a write operation) to write a logic value "1", the memory unit 11 is in the programmed state PGM("1"). When the memory unit 11 performs an erase operation to erase the logic value as "0", the memory unit 11 is in the erased state ERS("0").

Taking the memory unit 11 as an example, the drain-source voltage difference $V_{BL-SL}$ of the memory unit 11 is the voltage difference between the bit line voltage $V_{BL1}$ and the source line voltage $V_{SL1}$. When the drain-source voltage difference $V_{BL-SL}$ is smaller than the PN junction built-in potential $V_{BI}$ of the memory unit 11 ($V_{BI}$ is, for example, 0.6V), the memory unit 11 is in the erased state ERS("0"), and the memory unit 11 stores a logic value "0". On the other hand, when the drain-source voltage difference $V_{BL-SL}$ is greater than the forward break-over voltage $V_{FB}$ of the forward bias FWD ($V_{FB}$ is, for example, 1.4V), the drain-source voltage difference $V_{BL-SL}$ is in the range of the program bias PGM_B, which may trigger a positive feedback of the memory unit 11 to perform the write operation.

More specifically, when the drain-source voltage difference $V_{BL-SL}$ is less than 0V, the bit line current $I_{BL}$ of the memory unit 11 is very small, that is, the leakage current of the memory unit 11 is very small. The leakage current of the memory unit 11 is about 1E(−13) A, which is very close to 0 A. On the other hand, when the drain-source voltage difference $V_{BL-SL}$ of the memory unit 11 is between the PN junction built-in potential $V_{BI}$ and the forward break-over voltage $V_{FB}$, the drain-source voltage difference $V_{BL-SL}$ is in the range of the read bias RD_B. Due to the high nonlinearity of the current-voltage curve, in the range of the read bias RD_B, the on-off current ratio R_I of the memory unit 11 has a large value. More specifically, the on-off current ratio R_I is defined as the ratio of the current value of the bit line current IBL in the programmed state PGM("1") to the current value of the bit line current IBL in the erased state ERS("0"). The value of the on-off current ratio R_I is very large (for example: greater than 1E6), hence, within the range of the read bias RD_B, it may be clearly distinguished that the memory unit 11 is in the programmed state PGM ("1") and stores a logic value "1" or is in the erased state ERS("0") and stores a logic value "0". That is, the memory unit 11 itself has operating characteristics of a selector, and may perform read selection to distinguish whether the memory unit 11 stores a logic value "1" or a logic value "0", without need to disposing an additional selector. Therefore, the memory device 1000 may be referred to as a self-select memory device.

Figure 4A:
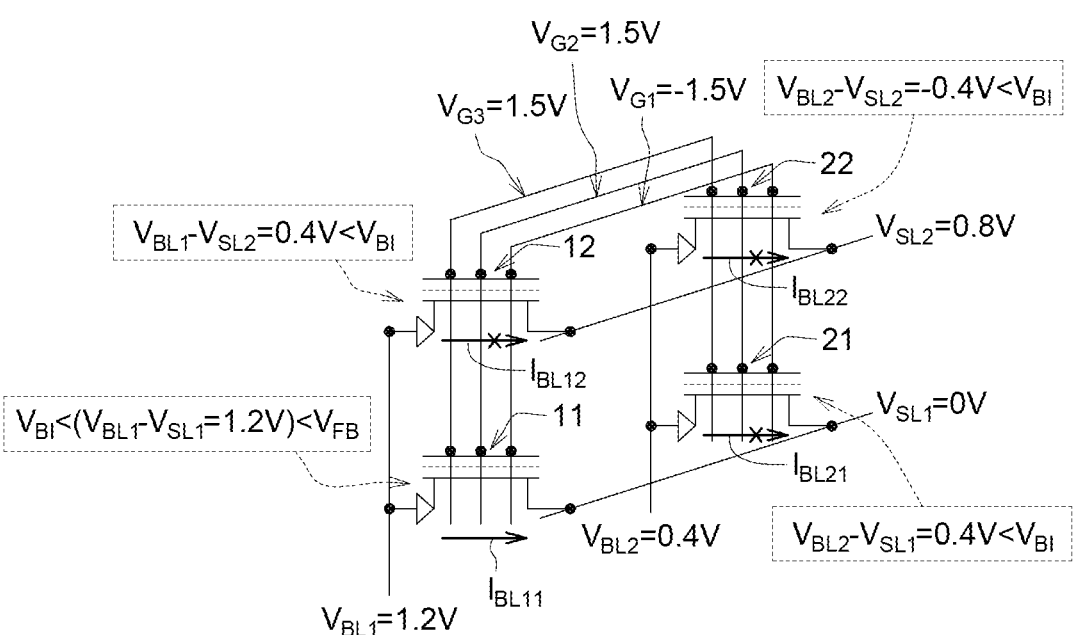
FIG. 4A is a schematic diagram of an embodiment of the read operation of the memory device in FIG. 2.

Next, please refer to FIG. 4A, which is a schematic diagram of an embodiment of the read operation of the memory device 1000 in FIG. 2, and also refers to the current-voltage curve shown in FIG. 3 correspondingly. FIG. 4A shows only a part of the memory device 1000 including adjacent memory units 11, 12, 21 and 22. In this embodiment, the memory unit 11 is selected to perform the read operation, therefore, the bit line BL1 and the source line SL1 coupled to the memory unit 11 are also selected, correspondingly. The unselected memory units 12, 21 and 22 are respectively coupled to the bit lines BL1 or BL2 and the source lines SL1 or SL2. The bit lines BL1 and BL2 are adjacent to each other, and the source lines SL1 and SL2 are adjacent to each other.

The bit line voltage $V_{BL1}$ received by the memory unit 11 through the bit line BL1 is 1.2V, and the source line voltage $V_{SL1}$ received through the source line SL1 is 0V, hence the drain-source voltage difference $V_{BL-SL}$ of the memory unit 11 is 1.2V, which is between the PN junction built-in potential $V_{BI}$ (0.6V) and the forward break-over voltage $V_{FB}$ (1.4V). That is, the drain-source voltage difference $V_{BL-SL}$ of the memory unit 11 is within the range of the read bias RD_B, and it may be read whether the memory unit 11 stores a logic value "1" or a logic value "0". And, each of the memory units 11, 12, 21 and 22 receives the same gate voltages $V_{G1}$, $V_{G2}$ and $V_{G3}$. For example, each of the memory units 11, 12, 21 and 22 receives a gate voltage $V_{G1}$ of −1.5V through the word line WL1, receives a gate voltage $V_{G2}$ of 1.5V through the word line WL2, and receives a gate voltage $V_{G3}$ of 1.5V through the word line WL3. Wherein, the position at which the word line WL1 is disposed, is closest to the source lines SL1 and SL2, so the gate voltage $V_{G1}$ received by the word line WL1 is negative value (i.e., −1.5V). The gate voltages $V_{G2}$ and $V_{G3}$ received by the other two word lines WL2 and WL3 are positive value (i.e., 1.5V).

For the unselected memory units 12, 21 and 22 other than the selected memory unit 11, the bit line voltage $V_{BL1}$ received by the memory unit 12 through the bit line BL1 is 1.2V, and the source line voltage $V_{SL2}$ received through the source line SL2 is 0.8V, so the drain-source voltage difference $V_{BL-SL}$ of the memory unit 12 is 0.4V, which is smaller than the PN junction built-in potential $V_{BI}$, hence the bit Line current $I_{BL12}$ of the memory unit 12 is close to 0 A. In addition, the bit line voltage $V_{BL2}$ received by the memory unit 21 through the bit line BL2 is 0.4V, and the source line voltage $V_{SL1}$ received through the source line SL1 is 0V, hence the drain-source voltage difference $V_{BL-SL}$ of the memory unit 21 is 0.4V, which is smaller than the PN junction built-in potential $V_{BI}$, hence the bit line current $I_{BL12}$ of the memory unit 12 is close to 0 A. Moreover, the bit line voltage $V_{BL2}$ received by the memory unit 22 through the bit line BL2 is 0.4V, and the source line voltage $V_{SL2}$ received through the source line SL2 is 0.8V, hence the drain-source voltage difference $V_{BL-SL}$ of the memory unit 22 is −0.4V, which is smaller than the PN junction built-in potential VBI, hence the bit line current $I_{BL22}$ of the memory unit 22 is close to 0 A. Since the bit line currents $I_{BL12}$, $I_{BL21}$ and $I_{BL22}$ of the unselected memory units 12, 21 and 22 are all close to 0 A, the memory device 1000 does not have a sneak path.

In the embodiment of FIG. 4A, the read operation is performed on the selected memory unit 11 by adjusting the bit line voltages $V_{BL1}$ and $V_{BL2}$ of the bit lines BL1 and BL2 and adjusting the source line voltages $V_{SL1}$ and $V_{SL2}$ of the source lines SL1 and SL2. For example, taking the bit line voltage $V_{BL1}$ received by the bit line BL1 coupled to the selected memory unit 11 as a baseline, the bit line voltage $V_{BL2}$ received by the bit line BL2 not coupled to the memory unit 11 is adjusted as the bit line voltage $V_{BL1}$ multiplied by a voltage ratio R1_V, and the voltage ratio R1_V is, e.g., "⅓". Similarly, the source line voltage $V_{SL2}$ received by the source line SL2 not coupled to the memory unit 11 is adjusted as the bit line voltage $V_{BL1}$ multiplied by a voltage ratio R2_V. The voltage ratio R2_V is, for example, "⅔", and the value of the voltage ratio R2_V is greater than the voltage ratio R1_V. The aforementioned voltage ratios R1_V and R2_V are not limited to "⅓" or "⅔", and may be other values. For example, the voltage ratio R1_V may be "0.3" or "0.35", and the voltage ratio R2_V may be "0.6" or "0.7", so that the drain-source voltage differences $V_{BL-SL}$ of the unselected memory units 12, 21 and 22 are all smaller than the PN junction built-in potential $V_{BI}$. On the other hand, the gate voltages $V_{G1}$, $V_{G2}$ and $V_{G3}$ are kept constant.

Figure 4B:
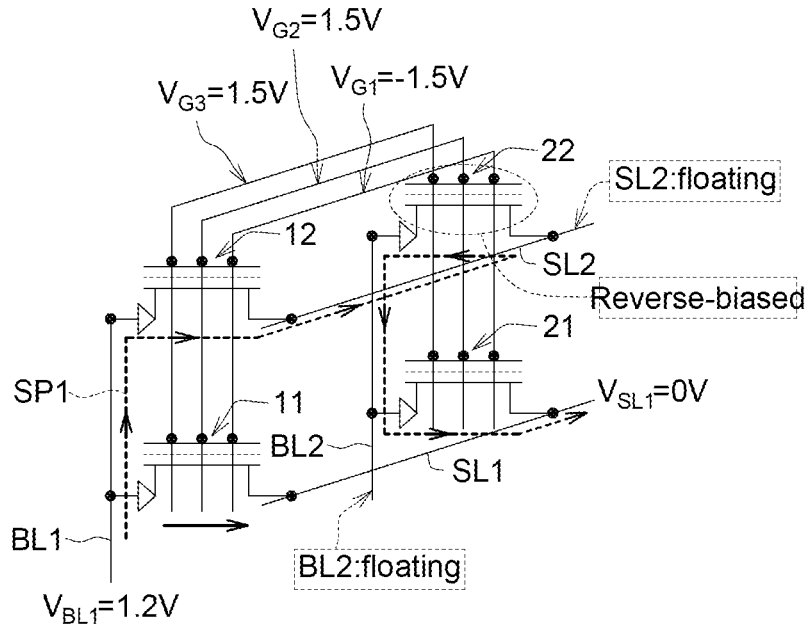
FIG. 4B is a schematic diagram of another embodiment of the read operation of the memory device in FIG. 2.

Next, please refer to FIG. 4B, which is a schematic diagram of another embodiment of the read operation of the memory device 1000 in FIG. 2. The embodiment of FIG. 4B also performs a read operation on the selected memory unit 11. Compared with the embodiment in FIG. 4A where the bit line voltage $V_{BL2}$ is adjusted as the bit line voltage $V_{BL1}$ multiplied by the voltage ratio R1_V and the source line voltage $V_{SL2}$ is adjusted as the bit line voltage $V_{BL1}$ multiplied by the voltage ratio R2_V. In the embodiment in FIG. 4B, the bit line BL2 and the source line SL2 not coupled to the selected memory unit 11 are in a floating state. In other words, the bit line BL2 and the source line SL2 not related to the selected memory unit 11 (i.e., the unselected bit line BL2 and source line SL2) are set as a floating state. Among the unselected memory units 12, 21 and 22, the memory unit 22 is in the state of reverse bias REV.

In this embodiment, a sneak path SP1 of a sneak current exists in the memory device 1000. The sneak path SP1 passes through the bit line BL1, the memory unit 12, the source line SL2, the memory unit 22, the bit line BL2, the memory unit 21 and the source line SL1, in order. Although the memory device 1000 has a sneak path SP1, the memory unit 22 in the reverse bias REV may block the sneak path SP1, hence the sneak current of the sneak path SP1 may be suppressed effectively.

Figure 5A:
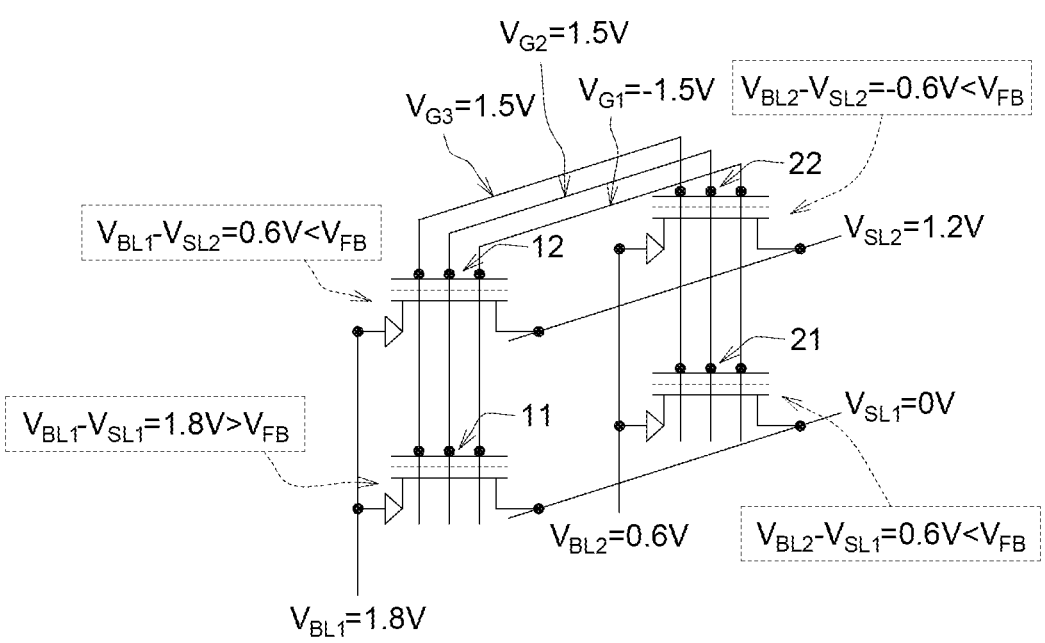
FIG. 5A is a schematic diagram of an embodiment of the write operation of the memory device in FIG. 2.

Next, please refer to FIG. 5A, which is a schematic diagram of an embodiment of the write operation of the memory device 1000 in FIG. 2, and also refer to the current-voltage curve shown in FIG. 3 correspondingly. In this embodiment, the write operation is performed on the selected memory unit 11 so as to write the logic value "1" into the memory unit 11. The gate voltages $V_{G1}$, $V_{G2}$ and $V_{G3}$ are kept as fixed values, which are −1.5V, 1.5V and 1.5V respectively. Furthermore, taking the bit line voltage $V_{BL1}$ received by the bit line BL1 coupled to the selected memory unit 11 as a baseline, the bit line voltage $V_{BL2}$ received by the unselected bit line BL2 is adjusted as the bit line voltage $V_{BL1}$ multiplied by the voltage ratio R1_V, and the source line voltage $V_{SL2}$ received by the unselected source line SL2 is adjusted as the bit line voltage $V_{BL1}$ multiplied by the voltage ratio R2_V.

For example, the bit line voltage $V_{BL1}$ received by the selected memory unit 11 is 1.8V, and the received source line voltage $V_{SL1}$ is 0V, hence the drain-source voltage difference $V_{BL-SL}$ of the memory unit 12 is 1.8V, which is greater than the forward break-over voltage $V_{FB}$ (the forward break-over voltage $V_{FB}$ is 1.4V), hence the positive feedback of the memory unit 11 is triggered, and the memory unit 11 is written a logic value "1" to become the programmed state PGM("1").

For the unselected memory units 12, 21 and 22 other than the selected memory unit 11, the bit line voltage $V_{BL1}$ received by the memory unit 12 is 1.8V, and the received source line voltage $V_{SL2}$ is 1.2V, hence the drain-source voltage difference $V_{BL-SL}$ of the memory unit 12 is 0.6V, which is smaller than the forward break-over voltage $V_{FB}$, and the positive feedback of the memory unit 12 may not be triggered. In addition, the bit line voltage $V_{BL2}$ received by the memory unit 21 is 0.6V, and the received source line voltage VSL1 is 0V, hence the drain-source voltage difference $V_{BL-SL}$ of the memory unit 21 is 0.6V, which is smaller than the forward break-over voltage $V_{FB}$, and the positive feedback of the memory unit 21 may not be triggered. Moreover, the bit line voltage $V_{BL2}$ received by the memory unit 22 is 0.6V, and the source line voltage $V_{SL2}$ received is 1.2V, hence the drain-source voltage difference $V_{BL-SL}$ of the memory unit 22 is −0.6V, which is smaller than the forward break-over voltage $V_{FB}$, and the positive feedback of the memory unit 22 may not be triggered.

Figure 5B:
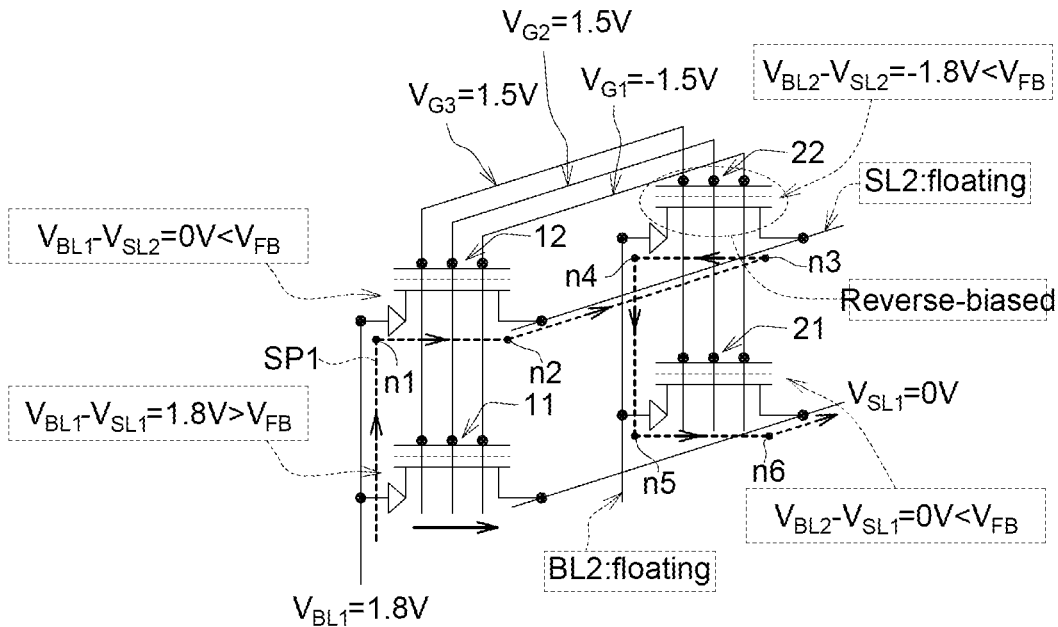
FIG. 5B is a schematic diagram of another embodiment of the write operation of the memory device in FIG. 2.

Next, please refer to FIG. 5B, which is a schematic diagram of another embodiment of the write operation of the memory device 1000 in FIG. 2. Compared with the embodiment in FIG. 5A where the bit line voltage $V_{BL2}$ is adjusted as the bit line voltage $V_{BL1}$ multiplied by the voltage ratio R1_V and the source line voltage $V_{SL2}$ is adjusted as the bit line voltage $V_{BL1}$ multiplied by the voltage ratio R2_V, for the embodiment in FIG. 5B the unselected bit line BL2 and the source line SL2 are set as the floating state.

The sneak path SP1 of the memory device 1000 has a plurality of nodes n1, n2, n3, n4, n5 and n6. Nodes n1 and n2 are substantially the drain and source of the memory unit 12, nodes n3 and n4 are substantially the source and drain of the memory unit 22, and nodes n5 and n6 are substantially the drain and source of the memory unit 21. Since the bit line BL2 and the source line SL2 are set as the floating state, and the potentials of the nodes n1 and n2 are both 1.8V, thus the drain-source voltage difference $V_{BL-SL}$ of the memory unit 12 is 0V, which is smaller than the forward break-over voltage $V_{FB}$ and positive feedback may not be triggered, and the memory unit 12 may not be written with a logic value "1" to become the programmed state PGM("1"). Moreover, the potentials of the nodes n5 and n6 are both 0V, so the drain-source voltage difference $V_{BL\text{-}SL}$ of the memory unit 22 is 0V, which is smaller than the forward break-over voltage $V_{FB}$ and the positive feedback may not be triggered, and the memory unit 21 may not be written a logic value "1" to become the programmed state PGM("1"). Furthermore, the potentials of the nodes n3 and n4 are 0V and 1.8V respectively, hence the drain-source voltage difference $V_{BL\text{-}SL}$ of the memory unit 22 is −1.8V, the memory unit 22 is in the state of the reverse bias REV, and the memory unit 22 may not be written a logic value "1" to become the programmed state PGM("1"). Moreover, the memory unit 22 with the reverse bias REV may block the sneak path SP1 and suppress the sneak current.

FIGS. 6A-6E are schematic diagrams of another embodiment of the write operation of the memory device 1000 in FIG. 2. Compared with the embodiment in FIG. 5A which performs the write operation of writing a logic value "1" to the selected memory unit 11, the embodiments in FIGS. 6A-6E perform an erase operation on the selected memory unit 11 so as to erase the logic value "1" stored in the memory unit 11 as a logic value "0" (in other words, perform a write operation of writing a logic value "0" to the memory unit 11). Before performing the erase operation, the logical values previously stored in the memory units 11, 12, 21 and 22 are "1", "1", "1" and "0".

More specifically, the memory units 11, 12, 21 and 22 arranged in the same array are coupled to the same word lines WL1-WL3, and the word lines WL1-WL3 are coupled to the same word line decoder.

When a memory unit in the array (such as the selected memory unit 11) is erased as a logic value "0", the bias voltages of the word lines WL1-WL3 must be re-setup. Since the memory units 11, 12, 21 and 22 are coupled to the same word lines WL1-WL3, the resetting of the bias voltages of the word lines WL1-WL3 will also affect the unselected memory units 12, 21 and 22, so that the unselected memory units 12, 21 and 22 are also erased to a logic value "0" at the same time, resulting in erroneous operation results. Therefore, before performing the erase operation, the previously stored logic values of all the memory units 11, 12, 21 and 22 in the array may be read-out, and the read logic values may be temporarily stored in a buffer or a register (not shown in the figure). After the erase operation is performed, the memory units 12 and 21 previously storing the logic value "1" may be applied with write operations, so as to write back the logic value "1" (write "1" back) to the memory units 12 and 21.

Figure 6A:
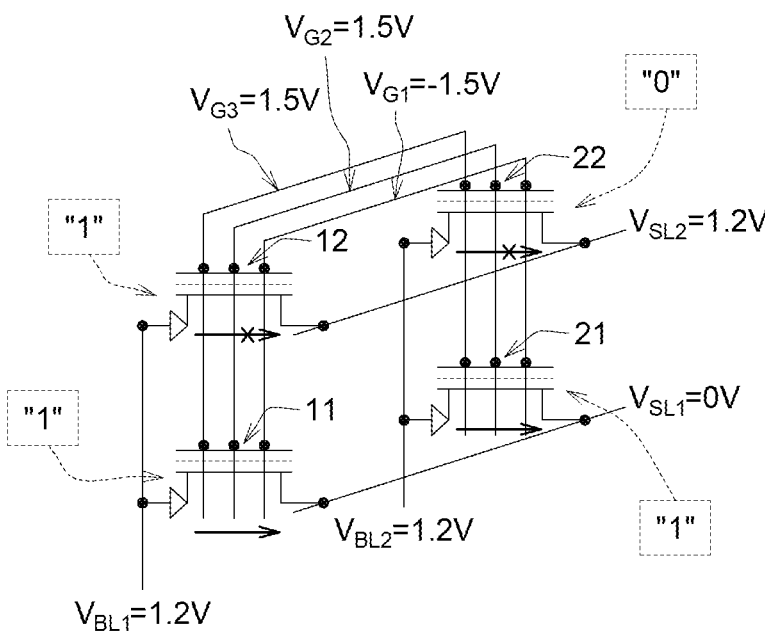
FIGS. 6A-6E are schematic diagrams of another embodiment of the write operation of the memory device in FIG. 2.
Figure 6B:
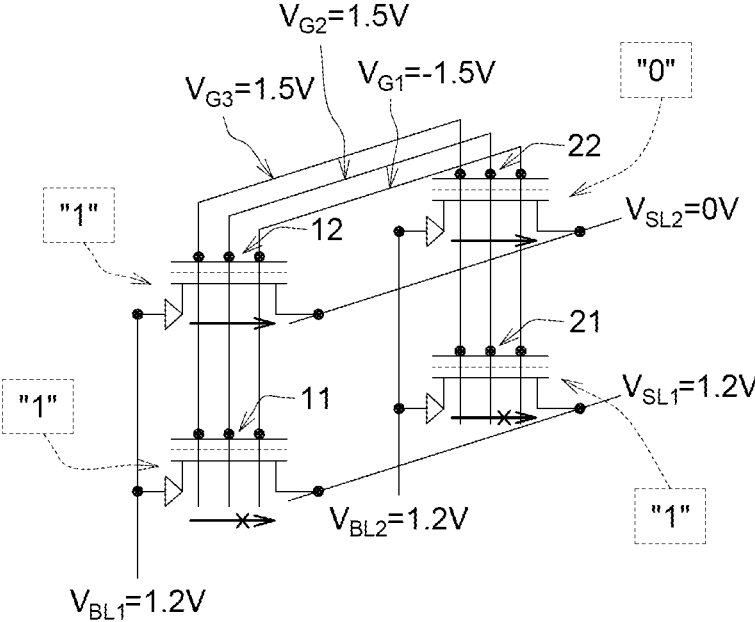

Please refer to FIGS. 6A and 6B, before performing the erase operation, read operations are performed in advance on all the memory units 11, 12, 21 and 22 in the array. The read operations are performed sequentially taking one source line as a batch. In FIG. 6A, the memory units 11 and 21 coupled to the first source line SL1 are first selected to perform a read operation. The bit line voltages $V_{BL1}$ and $V_{BL2}$ received by the bit lines BL1 and BL2 are both set to 1.2V, and the source line voltage $V_{SL1}$ received by the source line SL1 is set to 0V, so as to read the logic value "1" stored in the memory units 11 and 21. In this moment, the source line voltage $V_{SL2}$ received by the second source line SL2 is set to 1.2V.

Next, in FIG. 6B, the memory units 12 and 22 coupled to the second source line SL2 are selected to perform a read operation. The source line voltage $V_{SL2}$ received by the source line SL2 is adjusted as 0V, and the source line voltage $V_{SL1}$ received by the source line SL1 is adjusted as 1.2V, so as to read the logic value "1" of the memory unit 12 and the logic value "0" of the memory unit 22. In the read operations of FIGS. 6A and 6B, the gate voltages VG1, VG2 and VG3 are maintained at −1.5V, 1.5V and 1.5V.

Figure 6C:
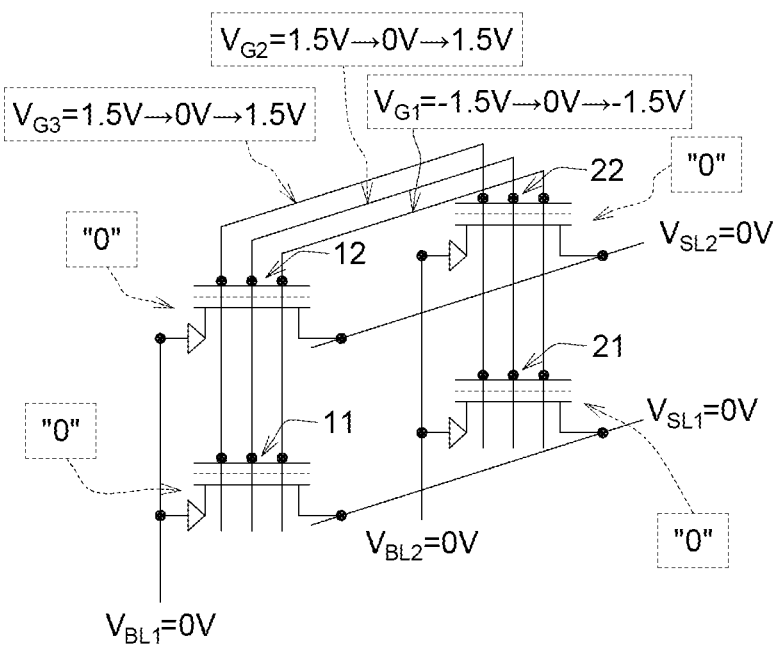

Next, referring to FIG. 6C, the memory units 11, 12, 21 and 22 coupled to the same word lines WL1-WL3 are re-setup (referred to as "reset"), so that the logic values stored in the memory units 11, 12, 21 and 22 are all reset to "0". When the reset is performed, the bias voltages of the word lines WL1, WL2 and WL3 (i.e., the gate voltages VG1, VG2 and VG3) are reset as 0V from the original voltage value, and then recovered as the original voltage value. For example, the gate voltage $V_{G1}$ is reset as 0V from −1.5V, and then recovered as −1.5V. Likewise, both the gate voltages $V_{G2}$ and $V_{G3}$ are reset as 0V from 1.5V, and then recovered as 1.5V. In addition, the bit line voltages $V_{BL1}$ and $V_{BL2}$ received by the bit lines BL1 and BL2 and the source line voltages $V_{SL1}$ and $V_{SL2}$ received by the source lines SL1 and SL2 are kept at 0V.

Figure 6D:
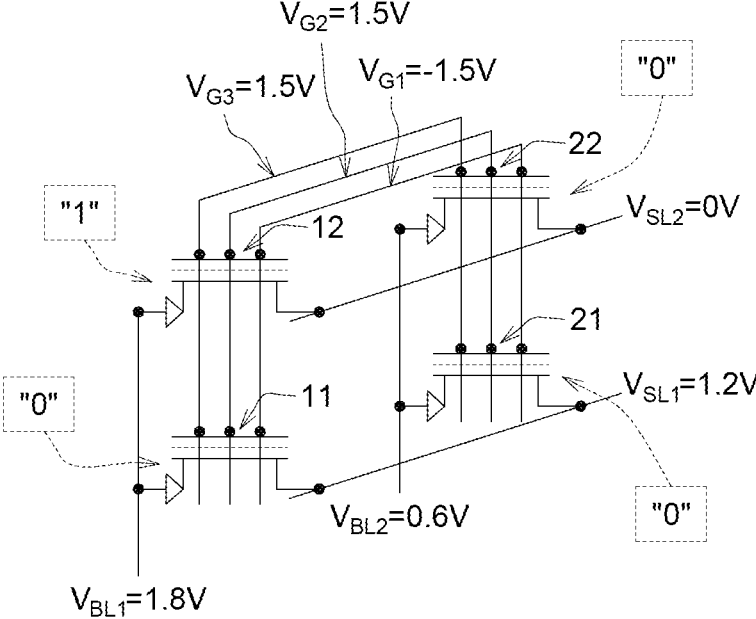
Figure 6E:
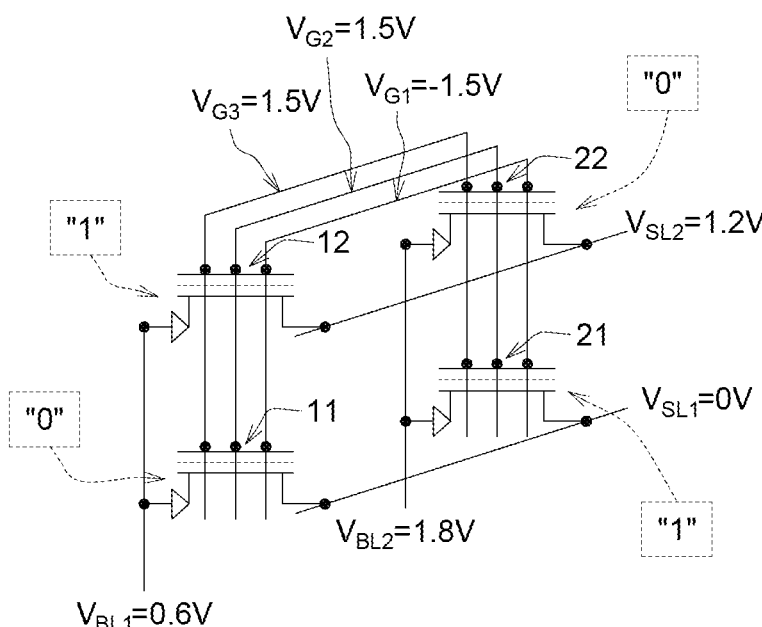

Next, referring to FIGS. 6D and 6E, write operations are performed on the memory units 12 and 21 which previously store the logic value "1", so as to write back logic value "1" to memory units 12 and 21. In FIG. 6D, the bit line voltage $V_{BL1}$ is set as 1.8V, the bit line voltage $V_{BL2}$ is set to 0.6V, the source line voltage $V_{SL1}$ is set to 1.2V, and the source line voltage $V_{SL2}$ is set to 0V, so as to select the memory unit 12 to perform a write operation writing a logic value "1". Then, in FIG. 6E, the bit line voltage $V_{BL1}$ is set to 0.6V, the bit line voltage $V_{BL2}$ is set to 1.8V, the source line voltage $V_{SL1}$ is set to 0V, and the source line voltage $V_{SL2}$ is set to 1.2V, so as to select the memory unit 21 to perform a write operation writing a logic value "1". After the write operations of the memory units 12 and 21 are performed, the unselected memory units 12, 21 and 22 have logic values the same as those previously stored. When the write operations are performed in FIGS. 6D and 6E, the gate voltages $V_{G1}$, $V_{G2}$ and $V_{G3}$ are kept at −1.5V, 1.5V and 1.5V.

Figure 7A:
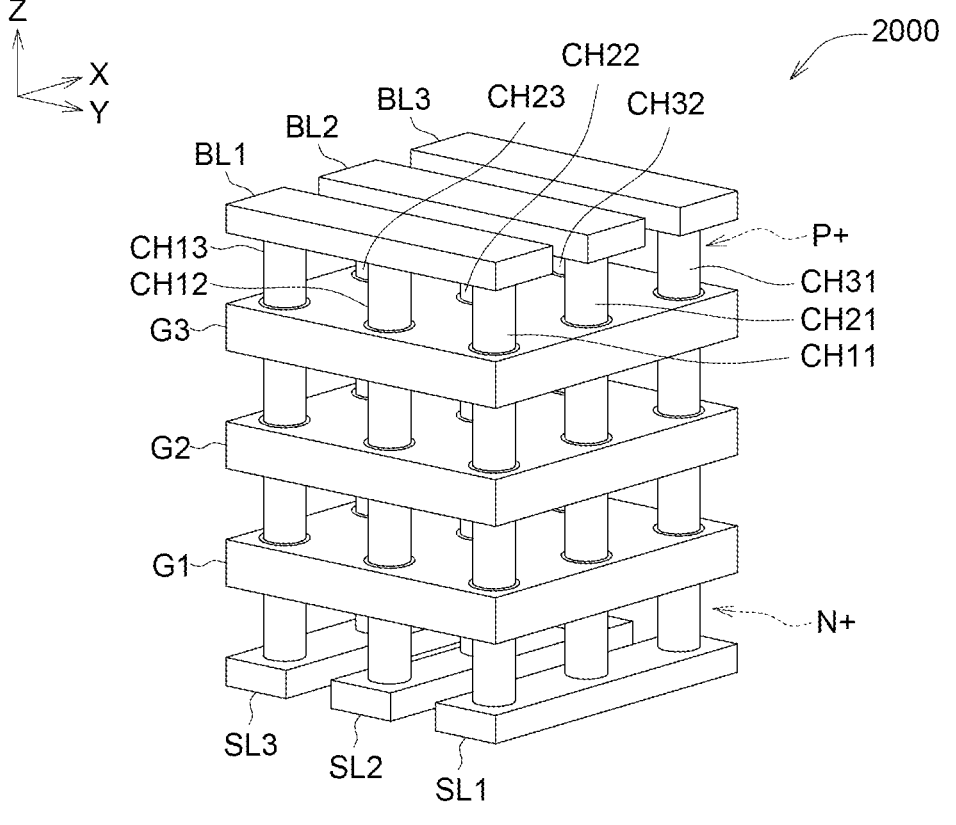
FIG. 7A a three-dimensional schematic diagram of a memory device according to another embodiment of the present disclosure.

Next, please refer to FIG. 7A, which is a three-dimensional schematic diagram of a memory device 2000 according to another embodiment of the present disclosure. The memory device 2000 of this embodiment is similar to the memory device 1000 of FIG. 1A, however, compared with the horizontally arranged channels CH11-CH34 of the memory device 1000 of FIG. 1A which extend in the Y direction, the channels CH11-CH33 of the memory device 2000 of this embodiment are vertically arranged and extend in the Z direction. In addition, compared with the bit lines BL1-BL3 and the source lines SL1-SL4 of the memory device 1000 in FIG. 1A which are arranged on the left and right sides of the memory device 1000, the bit lines BL1-BL3 and the source lines SL1-SL3 of the memory device 2000 of this embodiment are arranged on the upper and lower ends of the memory device 2000. For example, the bit lines BL1-BL3 are disposed on the top end of the memory device 2000, and the source lines SL1-SL3 are disposed on the bottom end of the memory device 2000.

More specifically, the bit lines BL1-BL3 extend in the Y direction, and are arranged in an order of: the bit line BL1, the bit line BL2 and the bit line BL3, according to the X direction. The source lines SL1-SL3 extend in the X direction, and are arranged in an order of: the source line SL3, the source line SL2 and the source line SL1, according to the Y direction. The gate structures G1-G3 of the memory device 2000 extends in the Y direction, and are arranged in an order of: the gate structure G1, the gate structure G2 and the gate structure G3, according to the Z direction.

The source lines SL1-SL3 are coupled to the N+ doped regions of the channels CH11-CH33, and the bit lines BL1-BL3 are coupled to the P+ doped regions of the channels CH11-CH33. The channel CH11 is coupled to the bit line BL1 and the source line SL1, the channel CH12 is coupled to the bit line BL1 and the source line SL2, the channel CH13 is coupled to the bit line BL1 and the source line SL3, and the like. The source lines SL1-SL3 are substantially perpendicular to the bit lines BL1-BL3, hence forming a one deck of three-dimensional stacked cross bar array.

Figure 7B:
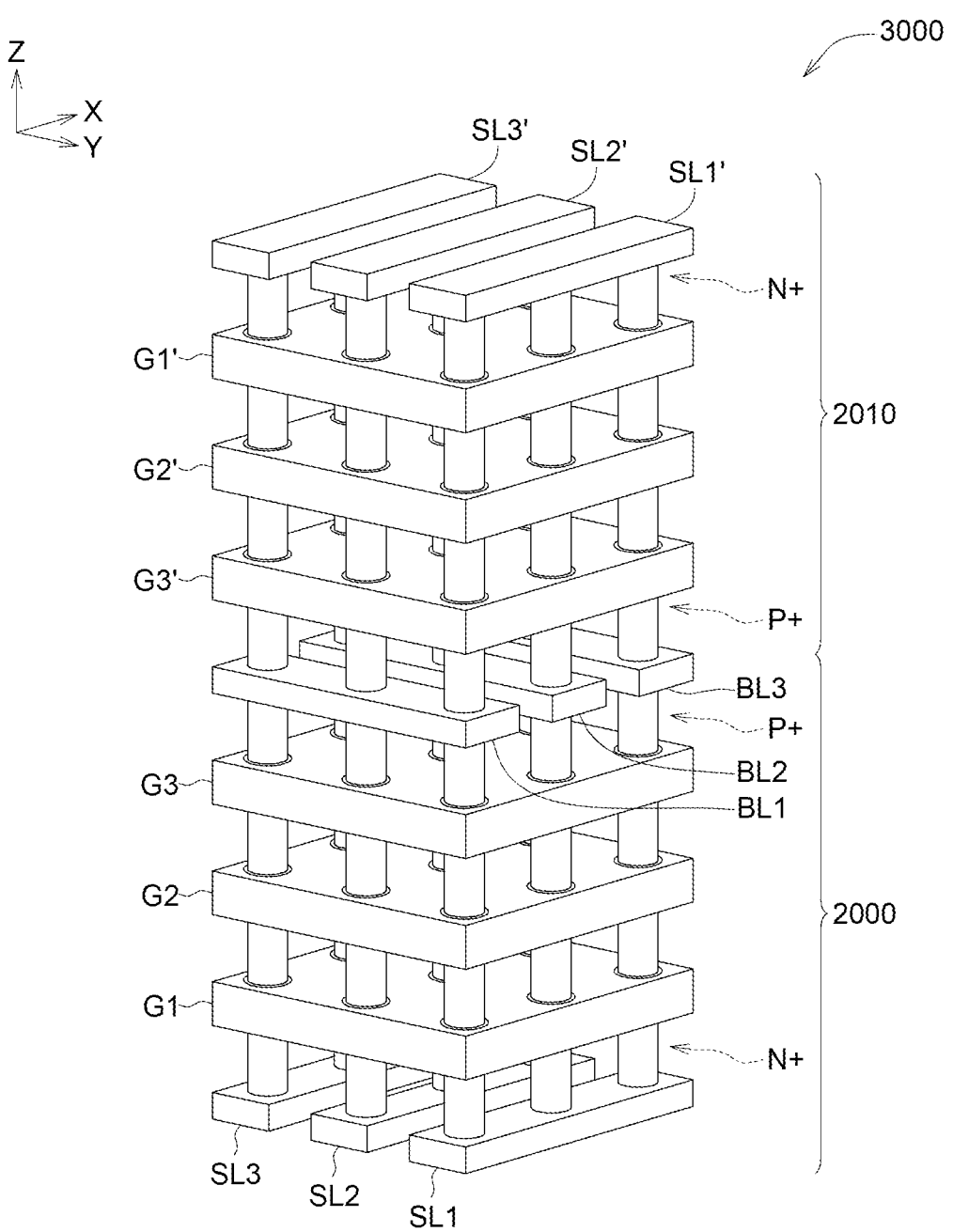
FIG. 7B is a three-dimensional schematic diagram of a memory device according to still another embodiment of the present disclosure.
Figure 8A:
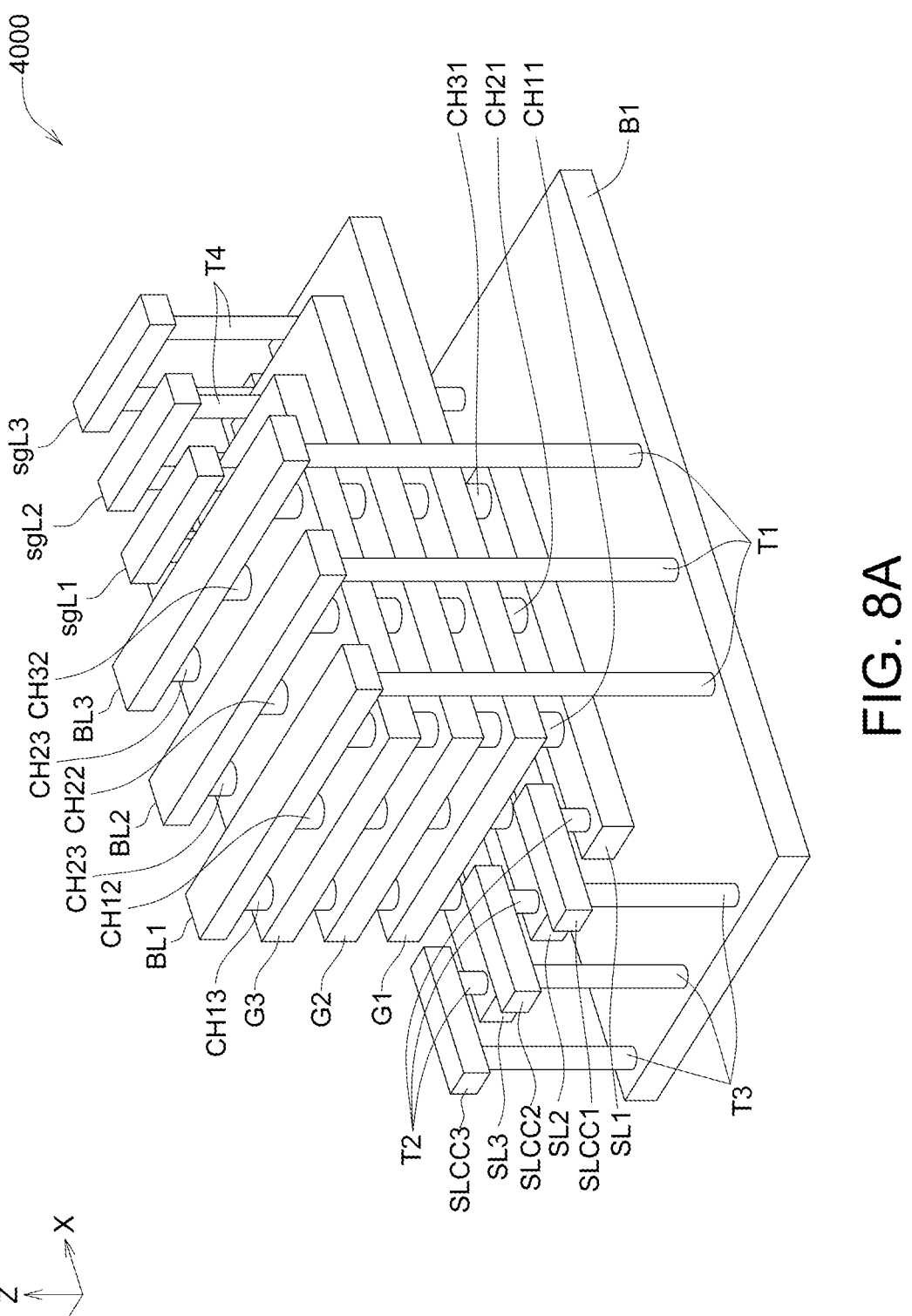
FIGS. 8A-8D are three-dimensional schematic diagrams of a memory device from different viewing angles according to yet another embodiment of the present disclosure.
Figure 8B:
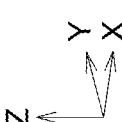
Figure 8C:
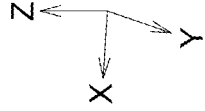
Figure 8D:
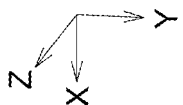

Next, please refer to FIG. 7B, which is a three-dimensional schematic diagram of a memory device 3000 according to another embodiment of the present disclosure. The memory device 3000 of this embodiment comprises two decks of crossbar array, and the memory device 3000 is composed of the memory device 2000 of FIG. 7A and another memory device 2010. The memory device 2000 serves as a bottom-deck structure of the memory device 3000, and the memory device 2010 serves as a top-deck structure of the memory device 3000.

The memory device 2010 may be formed by mirroring the memory device 2000 with respect to the XY plane. That is, the source lines SL1'-SL3', bit lines BL1-BL3 and gate structures G1'-G3' of the memory device 2010 are mirror-symmetric to the source lines SL1-SL3, bit lines BL1-BL3 and gate structures G1-G3 of the memory device 2000 with respect to the XY plane. The source lines SL1'-SL3' are disposed on the top end of the memory device 2010. The memory device 2010 shares the bit lines BL1-BL3 with the memory device 2000, and the bit lines BL1-BL3 are disposed at the bottom end of the memory device 2010. The gate structures G1'-G3' of the memory device 2010 are substantially parallel with the gate structures G1-G3 of the memory device 2000, and the source lines SL1'-SL3' of the memory device 2010 are substantially parallel with the source lines SL1-SL3 of the memory device 2000.

In the operation of the memory device 3000, the current of the bottom-deck memory device 2000 flows from the bit lines BL1-BL3 to the P+ doped region of the channel, flows along the negative direction of the Z direction to the N+ doped region of the channel, and then flows to the source lines SL1-SL3. On the other hand, the current of the top-deck memory device 2010 of the memory device 3000 is opposite to the current of the bottom-deck memory device 2000. The current of the memory device 2010 flows from the bit lines BL1-BL3 to the P+ doped region of the channel, flows along the positive direction of the Z direction to the N+ doped region of the channel, and then flows to the source lines SL1'-SL3'.

Next, please refer to FIGS. 8A-8D, which are three-dimensional schematic diagrams of a memory device 4000 from different viewing angles according to another embodiment of the present disclosure. The memory device 4000 of this embodiment is similar to the memory device 2000 of FIG. 7A, the difference is that: the memory device 4000 of this embodiment further comprises a bottom peripheral layer B1, a plurality of first signal lines sgL1-sgL3 and a plurality of through via connecting elements T1-T5.

The bottom peripheral layer B1 comprises a plurality of complementary metal oxide semiconductor (CMOS) elements. Based on the architecture of "CMOS under the array (CuA)", the CMOS elements of the bottom peripheral layer B1 are disposed under the cross bar array of the memory device 4000. The bottom peripheral layer B1 is substantially parallel with the gate structures G1-G3, and the source lines SL1-SL3 are disposed between the gate structures G1-G3 and the bottom peripheral layer B1.

In this embodiment, the gate structures G1-G3 form a stair structure, where the lengths of the gate structures G1-G3 in the X direction are sequentially decreased. The gate structure G1 has the largest length in the X direction, and the gate structure G3 has the smallest length in the X direction. The gate structures G1-G3 respectively have openings O1-O3.

The first signal lines sgL1-sgL3 are disposed on one side of the bit lines BL1-BL3, and the height of the first signal lines sgL1-sgL3 is substantially equal to that of the bit lines BL1-BL3. The first signal lines sgL1-sgL3 extend in the Y direction and are substantially parallel with the bit lines BL1-BL3. The gate structures G1-G3 are coupled to word line drivers (not shown) in bottom peripheral layer B1 through the first signal lines sgL1-sgL3 respectively.

The source line connecting elements SLCC1-SLCC3 are disposed on one side of the gate structure G1, and the height of the source line connecting elements SLCC1-SLCC3 is substantially equal to that of the gate structure G1. The source line connecting elements SLCC1-SLCC3 extend in the X direction and are substantially parallel with the source lines SL1-SL3.

The through via connecting elements T1-T5 extend in the Z direction and are substantially parallel with the channels CH11-CH33. The through via connecting elements T1 are coupled to the bit lines BL1-BL3 and the bottom peripheral layer B1. The source lines SL1-SL3 are coupled to the source line connecting elements SLCC1-SLCC3 through the through via connecting elements T2. The source line connecting elements SLCC1-SLCC3 are coupled to the bottom peripheral layer B1 through the through via connecting elements T3. The through via connecting elements T4 are coupled to the first signal lines sgL1-sgL3 and the gate structures G1-G3. The through via connecting elements T5 are coupled to the first signal lines sgL1-sgL3 and the bottom peripheral layer B1, and the through via connecting elements T5 passes through the openings O1-O3 of the gate structures G1-G3.

It will be apparent to those skilled in the art that various modifications and variations may be made to the disclosed embodiments. It is intended that the specification and examples be considered as exemplary only, with a true scope of the present disclosure being indicated by the following claims and their equivalents.

What is claimed is:
1. A memory device based on thyristors, comprising:
a plurality of gate structures, each extending in a first direction, and each of the gate structures is a continuous structure in the first direction;
a plurality of bit lines, each extending in a second direction, the second direction is substantially orthogonal to the first direction;
a plurality of source lines, each extending in the first direction;
a plurality of channels, each extending in a third direction and penetrating each of the gate structures, the third direction is substantially perpendicular to the first direction and the second direction, a first doped region of each channel is coupled to a corresponding one of the bit lines, and a second doped region of each channel is coupled to a corresponding one of the source lines; and
a plurality of memory units, each formed by the gate structures and a corresponding one of the channels,
wherein, the gate structures are sequentially arranged according to the third direction, the bit lines are sequentially arranged according to the first direction, the source lines are sequentially arranged according to the second direction to form a stair structure, and the lengths of the source lines in the first direction are sequentially decreased.

2. The memory device according to claim 1, wherein the bit lines comprise a first bit line and a second bit line adjacent to each other, and the source lines comprise a first source line and a second source line adjacent to each other, and the memory units comprising:

a first memory unit, a drain of the first memory unit is coupled to the first bit line, and a source of the first memory unit is coupled to the first source line, wherein, the first memory unit performs a read operation or a write operation in response to a voltage difference between the drain and the source of the first memory unit, and when the first memory unit performs the read operation or the write operation, the voltage of each of the gate structures remains at a fixed value.

3. The memory device according to claim 2, wherein each of the memory units is a gate-controlled-thyristor, each of the memory units operates in a forward bias state or a reverse bias state, each of the memory units has a PN junction built-in potential and a forward break-over voltage, each of the memory units has a read bias range between the PN junction built-in potential and the forward break-over voltage, and has a program range greater than the forward break-over voltage.

4. The memory device according to claim 3, wherein when the voltage difference between the drain and the source of the first memory unit is between the PN junction built-in potential and the forward break-over voltage, the first memory unit performs the read operation.

5. The memory device according to claim 4, wherein when the first memory unit performs the read operation:

a voltage difference between the first bit line and the second source line is smaller than the PN junction built-in potential, a voltage difference between the second bit line and the first source line is smaller than the PN junction built-in potential, and the voltage difference between the second bit line and the second source line is smaller than the PN junction built-in potential.

6. The memory device according to claim 3, wherein when the voltage difference between the drain and the source of the first memory unit is greater than the forward break-over voltage, the first memory unit performs the write operation.

7. The memory device according to claim 6, wherein when the first memory unit performs the write operation:

a voltage difference between the first bit line and the second source line is smaller than the forward break-over voltage, a voltage difference between the second bit line and the first source line is smaller than the forward break-over voltage, and a voltage difference between the second bit line and the second source line is smaller than the forward break-over voltage.

8. The memory device according to claim 3, wherein when the first memory unit performs the read operation or the write operation:

a voltage of the second bit line is equal to a voltage of the first bit line multiplied by a first voltage ratio, a voltage of the second source line is equal to a voltage of the first bit line multiplied by a second voltage ratio, the second voltage ratio is greater than the first voltage ratio, and a voltage of the first source line is equal to 0V.

9. The memory device according to claim 3, wherein when the first memory unit performs the read operation or the write operation:

the second bit line and the second source line are set as a floating state, and a voltage of the first source line is equal to 0V.

10. The memory device according to claim 9, wherein the memory units comprise:

a second memory unit, coupled to the second bit line and the second source line, wherein when the second bit line and the second source line are set as the floating state and the voltage of the first source line is equal to 0V, the memory device has a sneak path of a sneak current, the sneak path sequentially passes through the first bit line, the second source line, the second memory unit, the second bit line and the first source line, and the second memory unit operates in the reverse bias state to block the sneak path.

11. The memory device according to claim 3, wherein the first memory unit performs an erase operation in response to a resetting of the voltage of each of the gate structures, wherein the voltage of each of the gate structures is reset as 0V from an original voltage value, and then recovered as the original voltage value.

12. The memory device according to claim 11, wherein before the erase operation of the first memory unit, the memory units coupled to the first source line perform a read operation, and then the memory units coupled to the second source line perform a read operation, to read the logic values previously stored in the memory units of the first source line and the second source line.

13. The memory device according to claim 12, wherein after the erase operation of the first memory unit, the memory units previously storing a logic value "1" are selected to perform write operations to write back a logic value "1".

14. The memory device according to claim 1, further comprising:

a first patterned metal layer, comprising a plurality of first metal layer elements which are correspondingly coupled to the gate structures.

15. The memory device according to claim 14, further comprising:

a plurality of first connecting elements, each extending in the second direction, wherein the first connecting elements are sequentially arranged according to the first direction to be correspondingly coupled to the source lines having the stair structure, and the lengths of the first connecting elements in the second direction are sequentially decreased.

16. The memory device according to claim 15, further comprising:

a second patterned metal layer, comprising a plurality of second metal layer elements which are correspondingly coupled to the first connecting elements, wherein a projection of the first patterned metal layer on a first plane overlaps with a projection of the second patterned metal layer, and the first plane is defined by the first direction and the third direction.

17. The memory device according to claim 1, further comprising:

a plurality of top-deck source lines, substantially parallel with each of the source lines; and a plurality of top-deck gate structures, disposed between the top-deck source lines and the bit lines, and are substantially parallel with each of the gate structures, wherein, the top-deck gate structures are mirror-symmetrical to the gate structures with respect to a first plane, and the top-deck source lines are mirror-sym-metrical to the source lines with respect to the first plane, and the first plane is defined by the first direction and the third direction.

18. The memory device according to claim 1, further comprising:

a bottom peripheral layer, substantially parallel with the gate structures, and comprising a plurality of complementary metal oxide semiconductor (CMOS) elements, wherein the source lines are disposed between the gate structures and the bottom peripheral layer.

19. The memory device according to claim 18, further comprising:

a plurality of first through via connecting elements, substantially parallel with the channels, and coupled to the bit lines and the bottom peripheral layer.

20. The memory device according to claim 19, further comprising:

a plurality of first signal lines, substantially parallel with the bit lines; and a plurality of second through via connecting elements, substantially parallel with the channels and the first through via connecting elements, and coupled to the first signal lines and the gate structures.

* * * * *